(12) United States Patent
Kwak et al.

(10) Patent No.: US 9,147,477 B2
(45) Date of Patent: Sep. 29, 2015

(54) METHOD OF DRIVING NONVOLATILE MEMORY DEVICES

(71) Applicants: Dong-Hun Kwak, Hwaseong-Si (KR); Ki-Tae Park, Seongnam-Si (KR)

(72) Inventors: Dong-Hun Kwak, Hwaseong-Si (KR); Ki-Tae Park, Seongnam-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/446,351

(22) Filed: Jul. 30, 2014

(65) Prior Publication Data

US 2015/0131375 A1 May 14, 2015

(30) Foreign Application Priority Data

Nov. 11, 2013 (KR) ........................ 10-2013-0136351

(51) Int. Cl.
*G11C 16/06* (2006.01)
*G11C 16/24* (2006.01)
*G11C 16/26* (2006.01)
*G11C 16/34* (2006.01)
*G11C 16/10* (2006.01)

(52) U.S. Cl.
CPC ...................................... *G11C 16/10* (2013.01)

(58) Field of Classification Search
CPC ........... G11C 16/0483; G11C 11/5642; G11C 16/3468; G11C 16/3472; G11C 16/3481; G11C 16/10; G11C 16/0466; G11C 16/3418; G11C 11/5628; G11C 16/28; G11C 16/06; G11C 16/24
See application file for complete search history.

(56) References Cited

U.S. PATENT DOCUMENTS

| 7,142,455 | B1 | 11/2006 | Lee et al. | |
|---|---|---|---|---|
| 7,457,165 | B2 | 11/2008 | Jeong et al. | |
| 7,782,681 | B2 | 8/2010 | Kim et al. | |
| 8,213,233 | B2 | 7/2012 | Sarin et al. | |
| 8,307,152 | B2 | 11/2012 | Sarin et al. | |
| 2008/0192541 | A1* | 8/2008 | Kang et al. ................ | 365/185.03 |
| 2009/0067243 | A1* | 3/2009 | Takase et al. ............ | 365/185.11 |
| 2011/0157998 | A1 | 6/2011 | Yang | |
| 2012/0020155 | A1 | 1/2012 | Kim | |
| 2012/0099378 | A1* | 4/2012 | Cho ......................... | 365/185.19 |
| 2012/0127791 | A1 | 5/2012 | Lee | |
| 2012/0327718 | A1 | 12/2012 | Lee | |
| 2013/0308393 | A1* | 11/2013 | Youn ........................ | 365/189.05 |

FOREIGN PATENT DOCUMENTS

| JP | 2011100507 | 5/2011 |
|---|---|---|
| KR | 1020080103786 A | 11/2008 |

* cited by examiner

*Primary Examiner* — Hien Nguyen
(74) *Attorney, Agent, or Firm* — Volentine & Whitt, PLLC

(57) ABSTRACT

A method of driving a nonvolatile memory device, includes; forward shifting threshold voltages of nonvolatile memory cells by executing a first program loop with respect to the nonvolatile memory cells, and thereafter, reverse shifting the threshold voltages of the nonvolatile memory cells, and again forward shifting the threshold voltages of the nonvolatile memory cells by executing a second program loop with respect to the nonvolatile memory cells.

20 Claims, 14 Drawing Sheets

(a)

(b)

(c)

US 9,147,477 B2

METHOD OF DRIVING NONVOLATILE MEMORY DEVICES

CROSS-REFERENCE TO RELATED APPLICATIONS

This U.S. non-provisional patent application claims priority from Korean Patent Application No. 10-2013-0136351 filed on Nov. 11, 2013, the subject matter of which is hereby incorporated by reference.

BACKGROUND

The inventive concept relates generally to methods of driving a nonvolatile memory device.

The threshold voltage of programmed nonvolatile memory cells in certain nonvolatile memory devices and systems tend to change over time. There are many reasons for this adverse result having to with environmental factors, operational factors, and basic properties of materials used to fabricate the nonvolatile memory cells.

It not acceptable to have the threshold voltages of programmed nonvolatile memory cells to materially change over time, because the resulting "changed" threshold voltages may be misinterpreted, thereby resulting in read data errors.

SUMMARY

In one embodiment, the inventive concept provides a method of driving a nonvolatile memory device, comprising; forward shifting threshold voltages of nonvolatile memory cells by executing a first program loop with respect to the nonvolatile memory cells, and thereafter, reverse shifting the threshold voltages of the nonvolatile memory cells, and again forward shifting the threshold voltages of the nonvolatile memory cells by executing a second program loop with respect to the nonvolatile memory cells.

In another embodiment, the inventive concept provides a method of driving a nonvolatile memory device including first nonvolatile memory cells commonly connected to a first word line and second nonvolatile memory cells commonly connected to a second word line. The method comprises; forward shifting threshold voltages of the first nonvolatile memory cells by a first degree by executing a first program loop with respect to the first nonvolatile memory cells, and thereafter, reverse shifting the threshold voltages of the first nonvolatile memory cells by a second degree, and again forward shifting the threshold voltages of the first nonvolatile memory cells by a third degree by executing a second program loop with respect to the first nonvolatile memory cells.

In another embodiment, the inventive concept provides a method of driving a nonvolatile memory device including nonvolatile memory cells configured to be programmed according to a number of threshold voltage distributions including an erase voltage distribution and a highest voltage distribution, wherein a voltage range between the erase voltage distribution and the highest voltage distribution defines a threshold voltage window for the nonvolatile memory cells. The method comprises; performing a first program loop with respect to nonvolatile memory cells using a first set of program pulses to generate a first threshold voltage window, and thereafter, reverse shifting the threshold voltages of the nonvolatile memory cells, and performing a second program loop with respect to the nonvolatile memory cells using a second set of program pulses different from the first set of program pulse to generate a second threshold voltage window less wide than the first threshold voltage window.

In a flash memory device, for example, a charge trap flash (CTF) device, electrons trapped in a memory layer (e.g., a nitride layer) may be adversely rearranged over time. That is, a desired threshold voltage distribution may be changed over time. Certain embodiments of the inventive concept effectively address this potential problem. Additional advantages, objects, and features of the inventive concept will be set forth in part in the description which follows and in part will become apparent to those having ordinary skill in the art upon examination of the following or may be learned from practice of the inventive concept.

BRIEF DESCRIPTION OF THE DRAWINGS

The above and other objects, features and advantages of the present inventive concept will be more apparent from the following detailed description taken in conjunction with the accompanying drawings, in which.

DETAILED DESCRIPTION

Certain embodiments of the inventive concept will now be described in some additional detail with reference to the accompanying drawings. The inventive concept may, however, be embodied in many different forms and should not be construed as being limited to only the illustrated embodiments. Rather, these embodiments are provided so that this disclosure will be thorough and complete, and will filly convey the scope of the inventive concept to those skilled in the art. Throughout the written description and drawings, like reference numbers and labels are used to denote like or similar elements.

It will also be understood that when an element or component is referred to hereafter as being disposed or arranged "on" another element, said element or component may be disposed directly on the other element, or intervening elements may be present. In contrast, when an element is referred to as being disposed or arranged "directly on" another element, no intervening elements will be present.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

Figure 1:
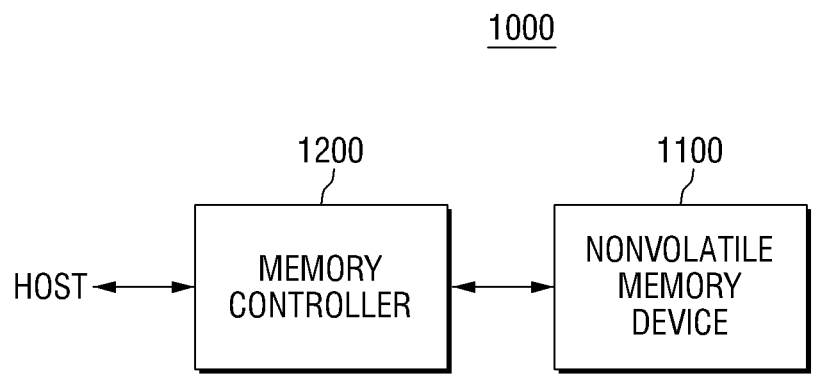
FIG. 1 is a block diagram illustrating a general storage device that may be operated in accordance with embodiments of the inventive concept.
Figure 2:
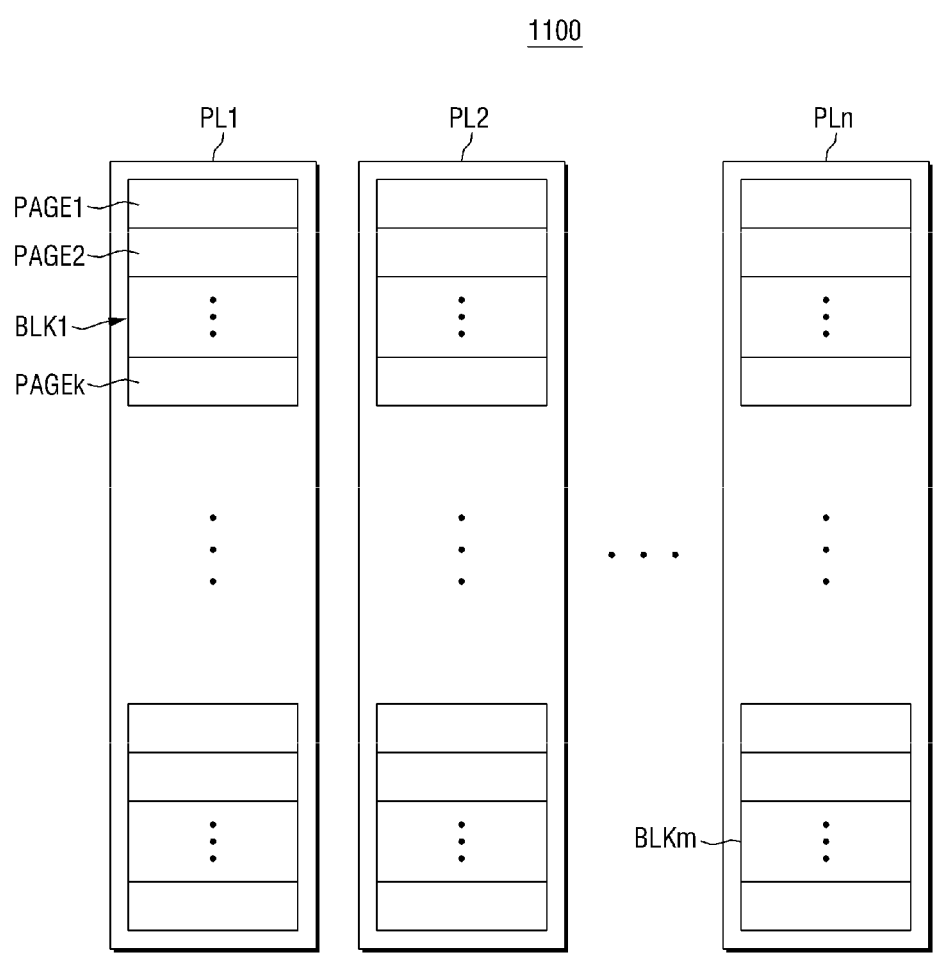
FIG. 2 is a block diagram further illustrating in one example the nonvolatile memory device 1100 of FIG. 1.
Figure 3:
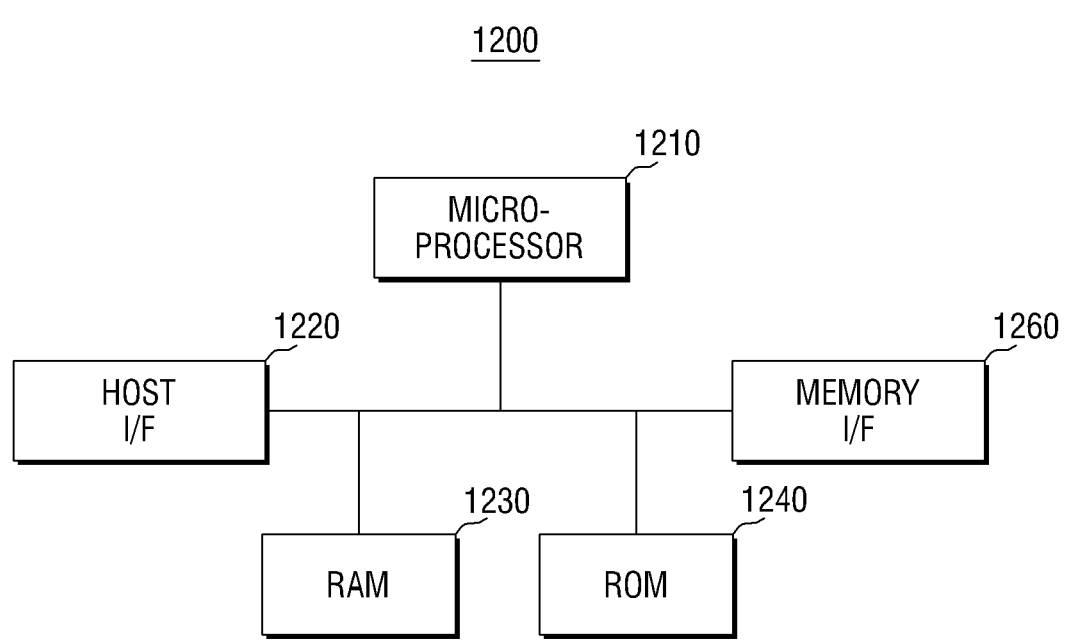
FIG. 3 is a block diagram further illustrating in one example the memory controller 1200 of FIG. 1.

FIG. 1 is a general block diagram illustrating a storage device that may be operated in accordance with embodiments of the inventive concept. FIG. 2 is a block diagram further illustrating in one example the nonvolatile memory device 1100 of FIG. 1. FIG. 3 is a block diagram further illustrating in one example the memory controller 1200 of FIG. 1.

Referring to FIG. 1, a storage device 1000 generally includes a nonvolatile memory device 1100 and a memory controller 1200.

The memory controller 1200 is connected between a host and the nonvolatile memory device 1100, and is configured to control various access operations directed to data stored (or being stored) in the nonvolatile memory device 1100 in response to one or more request(s) from the host. That is, the memory controller 1200 is configured to control at least read, write, and erase operations directed to one or more memory cells of the nonvolatile memory device 1100. In this regard, the memory controller 1200 is configured as an interface between the nonvolatile memory device 1100 and host.

The control functionality provided by the memory controller 1200 may variously be implemented using hardware, software and/or firmware.

The nonvolatile memory device 110 may be variously implemented using one or more types of nonvolatile memory, including as examples, the flash memory—e.g., charge trap flash or CTF device, read only memory (ROM), programmable ROM (PROM), electrically programmable ROM (EPROM), electrically erasable and programmable ROM (EEPROM), phase-change random access memory (PRAM), ferroelectric RAM (FRAM), and/or resistive RAM (RRAM).

The memory controller 1200 and nonvolatile memory device 1100 may be commonly integrated into a single semiconductor device or a memory card of various type, including as examples, a personal computer (PC) card such as those described by specifications provided by the Personal Computer Memory Card International Association, compact flash (CF) card, smart media card (SM or SMC), memory stick, multimedia card (MMC) such as RS-MMC, or MMC-micro, secure data (SD) card such as mini-SD, micro-SD, or SDHC, universal flash storage device (UFS), and/or the like.

In certain embodiments of the inventive concept, the memory controller 1200 and the nonvolatile memory device 1100 may be commonly integrated and appropriately configured to provide solid state drive (SSD). In cases where the storage device 1000 is configured as a SSD, the operating speed of the host connected to the storage device 1000 may be markedly improved over conventional storage device such as the hard disk drive (HDD), for example.

In other embodiments of the inventive concept, the storage device 1000 may be configured as a constituent element adapted for use in various contemporary electronic devices, such as a personal computer (PC), ultra-mobile PC, work station, net-book, personal digital assistant (PDA), portable computer, web tablet, wireless phone, mobile phone, smart phone, e-book, portable multimedia player (PMP), portable game machine, navigation device, black box, digital camera, three dimensional (3D) television receiver, digital audio recorder, digital audio player, digital picture recorder, digital picture player, digital video recorder, digital video player, general device capable of transmitting/receiving data in a wireless environment, one or more devices configured in a home network, computer network, computational system or telematics network, or an radio frequency identification device (RFID).

The nonvolatile memory device 1100 and/or storage device 1000 may be mechanically mounted and electrically connected using various types conventionally provided packaging. For example, the nonvolatile memory device 1100 and/or storage device 1000 may be packaged and mounted as PoP (Package on Package), Ball Grid Arrays (BGAs), Chip Scale Packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

FIG. 2 further illustrates one example of a hierarchical structure that may be used to configured the nonvolatile memory device 1100 for operation with the memory controller 1200. Here, the nonvolatile memory device 1100 is assumed to be physically and/or logically arranged according to a number of planes PL1 to PLn. Each one of planes PL1 to PLn is further arranged according a number of blocks BLK1 to BLKm. Each one of blocks BLK1 to BLKm is still further arranged according to a number of pages PAGE1 to PAGEk. A plurality of nonvolatile memory cells commonly connected to a particular word line are disposed in each one of the pages PAGE1 to PAGEk. That is, if a word line signal is applied to the particular word line, the signal is accordingly applied to the plurality of nonvolatile memory cells designated as a page, PAGE1 to PAGEk, associated with the word line.

FIG. 3 further illustrates in one example the memory controller 1200 of FIG. 1 as comprising a microprocessor 1210, a host interface 1220, a RAM 1230, a ROM 1240, and a memory interface 1260.

The host interface 1220 may be compatible with one or more conventionally understood data communications protocol(s) capable of controlling an exchange of commands, instructions, address information, controls signal(s) and/or associated data between the host and memory controller 1200. For example, the memory controller 1200 may be variously configured to communicate with a host using one or more interface protocols, including Universal Serial Bus (USB), Multimedia Card (MMC), Peripheral Component Interconnection (PCI), PCI-Express, Advanced Technology Attachment (ATA), serial-ATA, parallel-ATA, Small Computer Small Interface (SCSI), Enhanced Small Disk Interface (ESDI), and/or Integrated Drive Electronics (IDE).

The RAM 1230 is a memory that serves as a buffer. For example, the RAM 1230 may be used to store commands, addresses, and various kinds of variables that are received via the host interface 1220. The RAM 1230 may also be used to store data and various kinds of variables provided to the host from the nonvolatile memory device 1100.

The ROM 1240 may be used to store program instructions and/or data such as those used to drive firmware. Such program instructions may alternately or additionally be stored in various nonvolatile memory devices associated with or accessible by the memory controller 1200.

The memory interface 1260 enables exchanges of data, together with related commands, instructions, address information and/or control signal, between the nonvolatile memory device 1100 and memory controller 1200. In certain embodiments of the inventive concept, the memory interface 1260 may be a NAND flash memory interface and/or a NOR flash memory interface.

Those skilled in the art will recognize that various programming techniques may be used to "program" (i.e., write) a desired data value to a selected memory cell. The data value may be a single bit in the case of nonvolatile memory cells configured to store single level data (SLC), or a multiple bits in the case of nonvolatile memory cells configured to multilevel data (MLV). Many program operations use a number of iteratively executed "program loops" to program data to one or more "selected memory cells". The level of various control signals applied to the selected memory cells during a program operation may be varied according to program loop. For example, it is common to incrementally increase the voltage of certain control signals with each successive program loop of a program operation until all of the selected memory cells is properly programmed to the desired data value.

In this regard, respective data values stored by nonvolatile memory cells are indicated by corresponding threshold voltage distributions, or resistive ranges. Assuming the use of nonvolatile memory cells programmed according to a set of defined threshold voltage distributions, it is very important that programmed memory cells programmed to a particular data value properly exhibit exactly one of the defined set of threshold voltage distributions. However, this desired outcome proves quite difficult to achieve in many circumstances since many environmental and operational factors tend to undesirably alter the threshold voltages of constituent memory cell after completion of the program operation.

Figure 4:
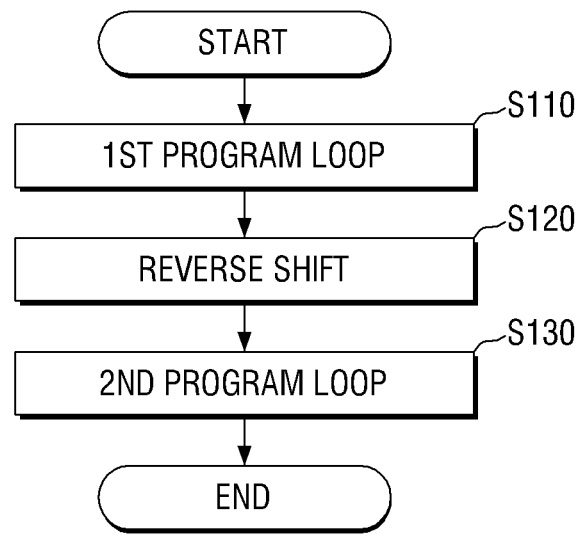
FIG. 4 is a flowchart summarizing a method of driving a nonvolatile memory device according to embodiment of the inventive concept.

FIG. 4 is a flowchart summarizing a method of driving a nonvolatile memory device according to certain embodiments of the inventive concept. The term "driving" is used in this context instead of "programming" since methods consistent with the inventive concept may be applied to selected memory cells, for example, during various maintenance operations, during a program operation, or following a programming operation.

Figure 5:
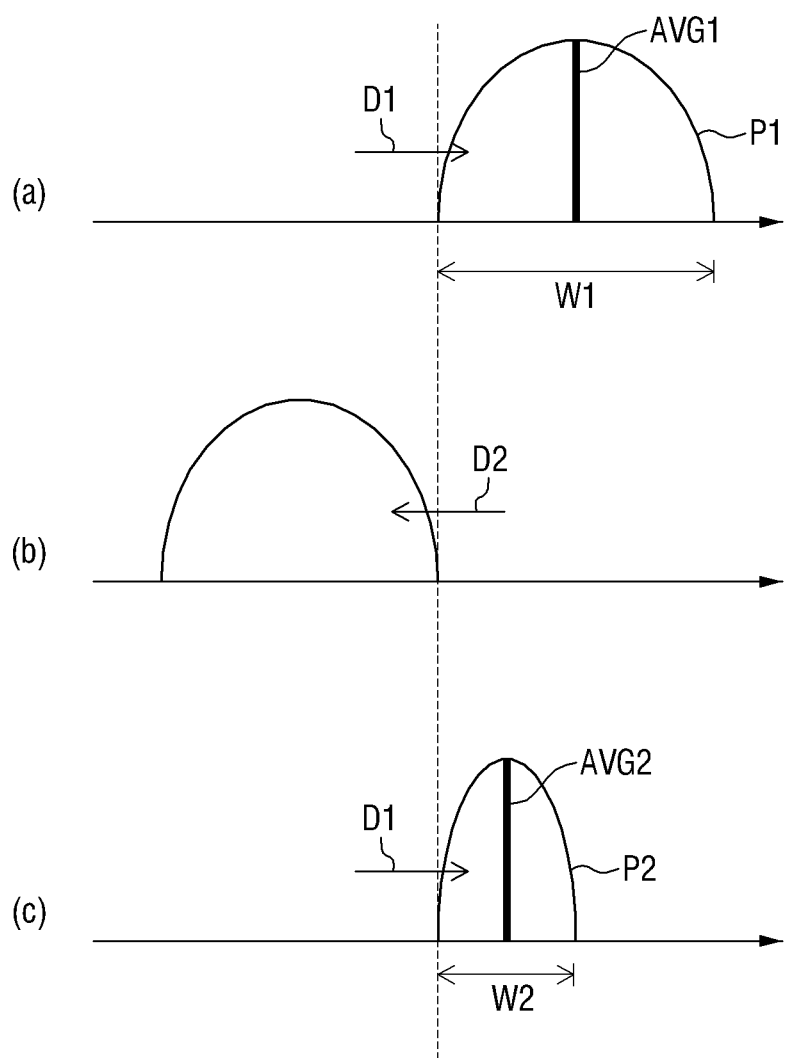
FIG. 5, inclusive of FIGS. 5A, 5B and 5C illustrates threshold voltage distribution shifting as the result of the driving method of FIG. 4.
Figure 6:
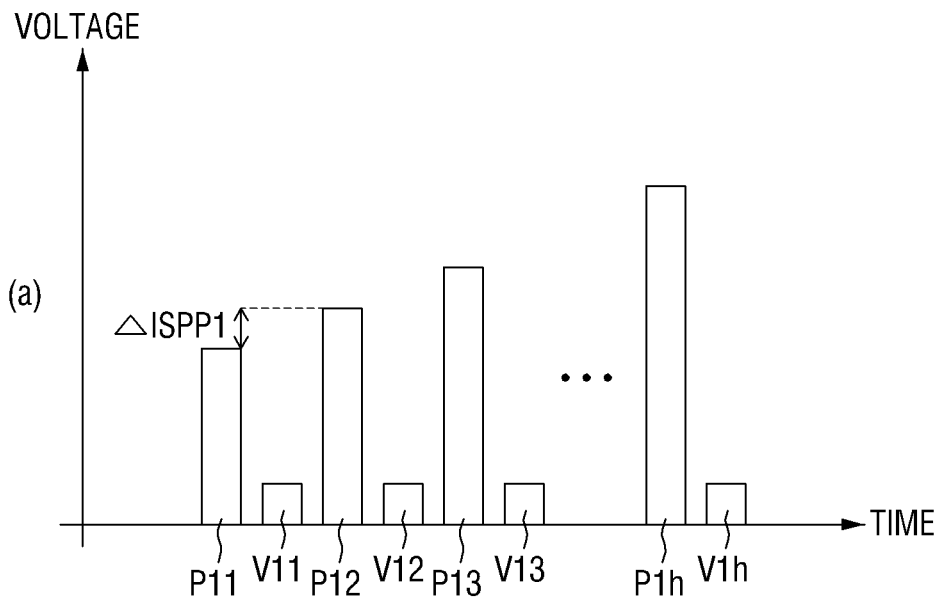
FIG. 6, inclusive of FIGS. 6A and 6B illustrate possible sets of program pulses that may be used during the program steps of FIG. 4.
Figure 6:
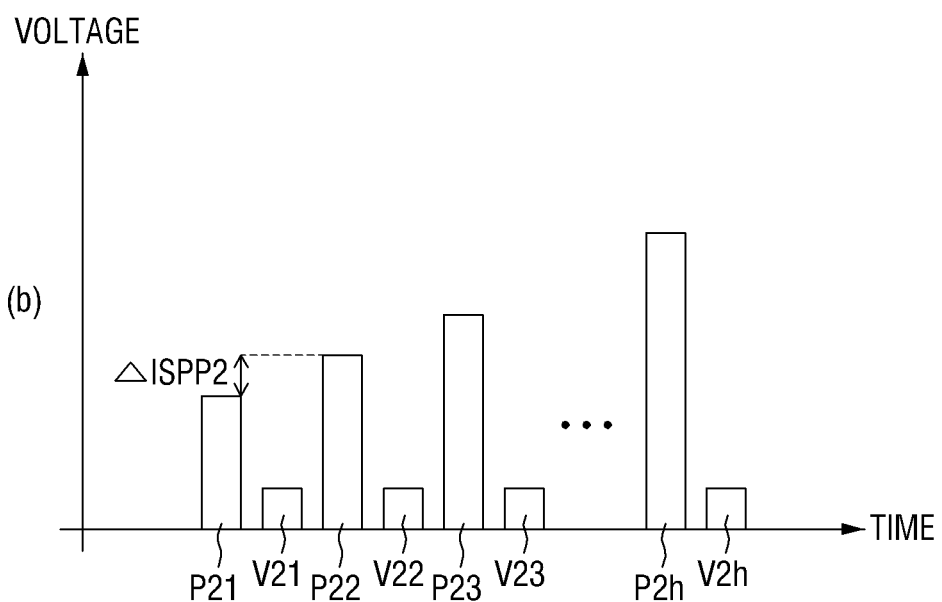
Figure 7:
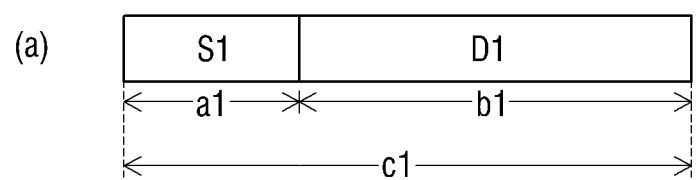
FIG. 7, inclusive of FIGS. 7A, 7B and 7C further illustrate the driving method of FIG. 4.
Figure 7:
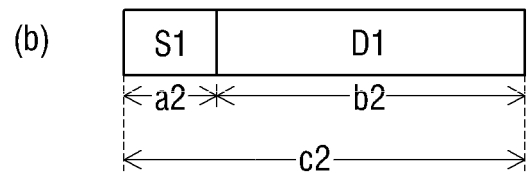
Figure 7:
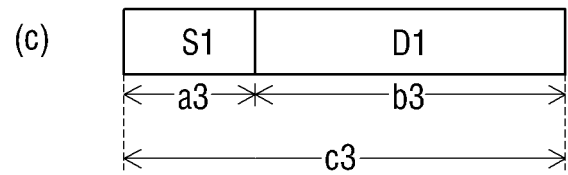

FIG. 5, inclusive of FIGS. 5A, 5B and 5C, further illustrates the effects of the respective steps in of driving method of FIG. 4 on the threshold voltage distribution of a selected memory cell. FIG. 6, inclusive of FIGS. 6A and 6B, further illustrates in one example certain program pulses (or driving pulses) that may be used during driving methods consistent with certain embodiments of the inventive concept. FIG. 7, inclusive of FIGS. 7A, 7B and 7C, further illustrates the effects provided by the driving method of FIG. 4.

Referring initially to FIGS. 4 and 5, the respective threshold voltages of a selected nonvolatile memory cells are right-shifted (or forward-shifting, or shifted in a positive direction d1) during a first program loop, arbitrarily selected and executed during a program operation (S110). That is, assuming that a driving operation is executed according to a defined Incremental Step Pulse Program (ISPP) method, a first sequence of program pulses (P) and following verification pulses (V) may be applied as shown in FIG. 6A. Thus, the first program loop may be performed using a plurality of first program pulses P11 to P1$h$ (including a first initial program pulse P11 and a first final program pulse P1$h$), where the respective levels of the first program pulses P11 to P1$h$ increase with each successive iteration according to a first increment step ($\Delta$ISPP1).

As a result of executing the first program loop, a threshold voltage distribution P1 shown in FIG. 5A may be obtained for the selected nonvolatile memory cells, where W1 denotes an initial width of the threshold voltage distribution P1, and AVG1 denotes a first average threshold voltage level for the threshold voltage distribution P1.

Then, the threshold voltages of the selected nonvolatile memory cells are left-shifted (or reverse-shifted, or shifted in a negative direction d2) following completion of the first program loop, but before execution of a second program loop (S120).

The terms "forward" and "reverse" shifting are used herein without necessary correlation to respective positive and negative voltage shifting of one or more memory cell threshold voltage(s). Rather, these terms are used to denote respective voltage shifts made in opposite arbitrary directions. Thus, in certain embodiments of the inventive concept, "forward shifting" (e.g., a voltage shift arising from execution of a first or second program loop) may move one or more memory cell threshold voltages in a negative direction, whereas reverse shifting" (e.g., a voltage shift arising from execution of a reverse shift step) may move one or more memory cell threshold voltages in a positive direction.

The effects of the reverse-shift step upon the threshold voltage distribution of the selected memory cells is shown in FIG. 5B in comparison with FIG. 5A. In the context of certain embodiments of the inventive concept, the selected nonvolatile memory cells are weakly erased by the reverse-shift step (S120) following execution of a first program loop (S110). However, not all embodiments of the inventive concept must necessarily reverse-shift to an extent wherein the selected memory cells are deemed to be weakly erased. Reverse-shifts of a lesser degree relative to a preceding forward-shift may be used with good results in certain embodiments of the inventive concept.

Then, following the reverse shift step (S120) the threshold voltages of the selected nonvolatile memory cells are again forward-shifted using a second program loop with the results being shown in FIG. 5C (S130).

Here again, it is assumed that the second program loop is performed using a defined ISPP method. However, as illustrated in FIG. 6B, the second program loop may use a different programming approach using different control signal level(s) (e.g., a second ISSP method using a different incremental step increase $\Delta$ISPP2) as compared with the programming approach used during the first program loop. For example, the respective levels of the sequential program pulses (P2) applied by the second programming approach during the second program loop (FIG. 6B) are each less than corresponding sequential program pulses (P1) applied by the first programming approach during the first program loop (FIG. 6A).

As a result, of the second program loop (S130) following the first program loop (S110) and the reverse shift (S120), a final threshold voltage distribution P2 may be obtained as illustrated in FIG. 5C. Here, W2 denotes a much more narrow threshold voltage distribution width for the final threshold voltage distribution P2, and AVG2 denotes a lesser average voltage level for the threshold voltage distribution P2.

In the context of the working embodiment described in relation to FIGS. 4, 5 and 6, the first set of program pulses P11 to P1h is different from the second set of program pulses P21 to P2h. That is, comparing the program pulses illustrated in FIGS. 6A and 6B, the first incremental step (ΔISPP1) is larger than the second incremental step (ΔISPP2). Further, the second initial pulse P21 among the set of second program pulses P21 to P2h is less than or equal to a first final program pulse P1h among the set of first program pulses P11 to P1h. Further, the second initial pulse P21 among the set of second program pulses P21 to P2h is less than the first initial program pulse P11 among the set of first program pulses P11 to P1h.

Of course, many different programming approaches may be used for various embodiments of the inventive concept, but by carefully adjusting a sequence of second program pulses used during a second program loop—as compared with first program pulses used during a preceding first program loop—the width of a final threshold voltage distribution resulting from the second program loop may be markedly less than the width of an initial threshold voltage distribution resulting from the first program loop.

These results may be better understood upon collective consideration of FIGS. 1, 4 and 7. Assuming the use of CTF memory cells in the nonvolatile memory device 1100, FIG. 7 conceptually illustrates the accumulation (or trapping) of electrons by a memory layer of the CTF memory cells during execution of the driving method summarized in FIG. 4.

FIG. 7A shows results following execution of the first program loop (S110), wherein electrons are trapped in both a shallow region S1 and a deep region D1 of the selected CTF memory cells. Of note, there is high probability that at least some of the electrons trapped in the shallow region S1 will become adversely "rearranged" over time, whereas the electrons trapped in the deep region D1 are far less likely to be similarly rearranged. Thus, as compared with the electrons trapped in the deep region D1, the electrons trapped in the shallow region S1 are much more likely to generate tail regions (e.g., an upper tail region and/or a lower tail region) of the threshold voltage distribution of the selected CTF memory cells.

With reference to FIG. 7A, assuming a total c1 of electrons trapped in an exemplary CTF memory following the first program loop (S110), a1 of these total electrons will be trapped in the shallow region S1, while b1 of the electrons will be trapped in the deep region D1. If successive program loops similar to the first program loop were executed after the first program loop, the number of electrons trapped in the shallow region S1 might fall to become roughly proportional to the number of electrons trapped in the deep region D1. That is, with successively executed, similarly forward-biased, program loops the number of electrons trapped in the deep region D1 might minimally increase as the number of electrons trapped in the shallow region S1 increases. Accordingly, the number of electrons trapped in the deep region D1 upon execution of the first program loop will be close to a maximum, without regard to the number of electrons trapped in the shallow region S1.

Now, referring to FIGS. 1, 4 and 7B, during execution of the reverse shift, the threshold voltages of the selected CTF memory cells are shifted in the reverse direction relative to the forward shifting obtained during the first program loop. As a result, some of the electrons trapped in the memory layer of a CTF memory cell by the first program loop will escape. So, very much like a weak erase operation might, the reverse shift step causes the total number of electrons trapped CTF memory cell to fall from c1 to c2. Yet, it is primarily the electrons trapped in a shallow region S1 by the first program loop that readily escape the CTF memory cell in response to the reverse shift step. relatively speaking, far fewer of the electrons trapped in the deep region D1 escape from the CTF memory cell during the reverse shift step. Thus, in the illustrated example of FIG. 7, a difference between (a1−a2) is greater than a difference (b1−b2).

Hence, execution of the reverse shift step (S120) tends to minimize the number of electrons trapped in the shallow region S1 of the CTF memory cell.

Referring now to FIGS. 1, 4 and 7C, following execution of the second program loop, the number of electrons trapped in the shallow region S1 increases from a2 to a3. However, the number of electrons trapped in a deep region D3 more greatly increases from b2 to b3.

So, consistent with the illustrated example of FIG. 7, a first total number of electrons c1 trapped in the memory layer of a CTF memory by the first program loop may well be greater than a second total number of electrons c2 trapped in the memory layer of the CTF memory cell by the second program loop. However, the number of electrons trapped in the deep region D1 of the CTF memory cell following the second program loop may be better matched to a desired target value, where the "target value" may be established according to particular range of electrons desired to be trapped, or a resulting range for the corresponding threshold voltage distribution.

And since the number of electrons trapped in the shallow region S1 following the reverse shift step is greatly reduced, the ratio b1/a1 (e.g., 1:10) for the first program loop may be higher than the ratio b3/a3 (e.g., 1:15) for the second program loop.

As a result of the foregoing memory cell conditioning effects, the desired threshold voltage distribution for programmed nonvolatile memory cells will not can adversely change over time to cause threshold voltage distribution spreading or drooping. That is, the number of electrons trapped in the deep region D1 following the second program loop is far less likely to change over time.

In certain embodiments of the inventive concept, the forward and/or reverse shifting steps of may be performed differently on a word line-by-word line basis (or a page basis). That is, the nonvolatile memory cells connected to a first word line may be forward/reverse shifted by one degree, while the nonvolatile memory cells connected to a second word line are forward/reverse shifted by another degree using differently defined, respective control signals.

Further, the reverse shifting step may be performed on a block basis, and may be performed differently on a block-by-block basis. That is, all of the nonvolatile memory cell connected in a first block may be reverse shifted by a first degree, while the nonvolatile memory cell connected to a second block different from the first block are reverse shifted to a second degree different than the first degree.

In this context, a particular "degree" of threshold voltage shifting may be expressed in terms of a relative positive voltage change, or a relative negative voltage change.

Further, the degree and nature of the reverse shifting step may vary with programming mode for the nonvolatile memory device. For example, certain nonvolatile memory cells programmed according to a first programming mode may be reverse shifted to a first degree, while nonvolatile memory cells programmed according to a second programming mode may be reverse shifted to a second degree different from the first degree. For example, a first programming mode might be applied to SLC while a second programming mode is applied MLC.

Further, the reverse shifting may be differently controlled depending on the material properties (e.g., wear level state) of different sets of memory cells. That is, first nonvolatile memory cell(s) having a first deterioration state may be reverse shifted to a greater degree than second nonvolatile memory cell(s) having a second and less deterioration state. In certain embodiments of the inventive concept, differing wear levels may be accounted for by control logic (e.g., a program/erase operation counter) in the memory controller 1200 of FIG. 1. Once the number of executed program/erase operations for a particular set of memory cells exceeds a threshold, it may be assumed that (e.g.,) the memory layer (e.g., a nitride layer) of the CTF memory cells are significantly worn.

In certain embodiments, the deterioration state of nonvolatile memory cells may be determined according to an erased upper memory cell. The term "erased upper memory cell" denotes a memory cell positioned at an upper region in the erase distribution. Since this particular memory cell that is positioned in the upper region, it may over time be classified as a weak cell. Accordingly, if there are a large number of erase upper cells, it may be considered that the nonvolatile memory cells have been greatly deteriorated.

Figure 8:
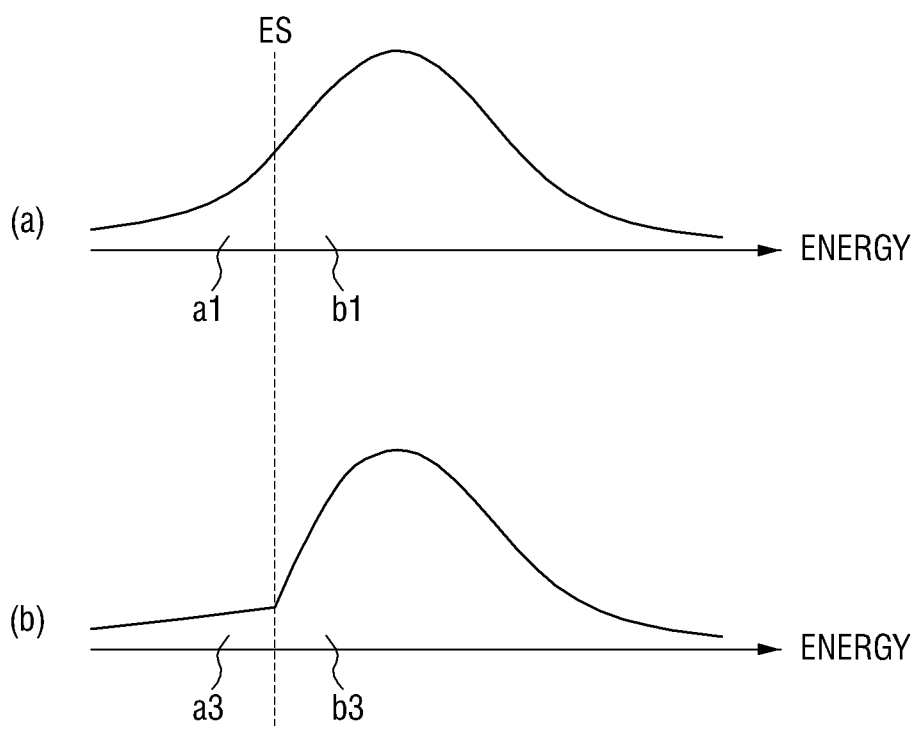
FIG. 8, inclusive of FIGS. 8A and 8B, illustrates distributions resulting from the method of driving a nonvolatile memory device according to certain embodiments of the inventive concept.

FIG. 8, inclusive of FIGS. 8A and 8B, illustrates comparative threshold voltage distributions and serves to further explain methods of driving a nonvolatile memory device according to certain embodiments of the inventive concept.

The expositional nature of FIG. 8 is conceptually related to the foregoing description provided in relation to FIG. 7, albeit differently expressed. Here, x-axis indicates energy while the y-axis indicates a number of memory cells.

Referring to FIG. 7 and FIG. 8A, an initial threshold voltage distribution is derived following execution of the first program loop of FIG. 4. After execution of the first program loop, the first number a1 of electrons will be trapped with an energy level that is lower than the reference energy level ES in the CTF memory cell. Here, the first number a1 of electrons may largely be equal to the number of electrons trapped in the shallow region S1 of the CTF cell. In a similar manner, the number b1 of electrons trapped with an energy level that is higher than the reference energy level ES. Here, the number b1 of electrons may be equal to the number of electrons trapped in the deep region D1 of the CTF cell.

Referring to FIG. 7 and FIG. 8B, a final threshold voltage distribution is derived following execution of the second program loop of FIG. 4. After the second program loop, the third number a3 of electrons will be trapped with an energy level that is lower than the reference energy level ES in the CTF memory cell. Here, the third number a3 of electrons may be equal to the number of electrons trapped in the shallow region S3 of the CTF cell. In a similar manner, the number b3 of electrons may be trapped with an energy level that is higher than the reference energy level ES. Here, the number b3 of electrons may be equal to the number of electrons that are trapped in the deep region D3 of the CTF memory cell.

Hence, the first number a1 of electrons may be larger than the third number a3 of electrons.

As described above, by performing the first program loop, followed by reverse shift step (e.g., a weak erase), and then followed by a second program loop, the number of electrons trapped in the shallow region S3 may be reduced or minimized. Accordingly, the possibility of adverse electron rearrangement over time for programmed memory cells is also reduced.

Figure 9:
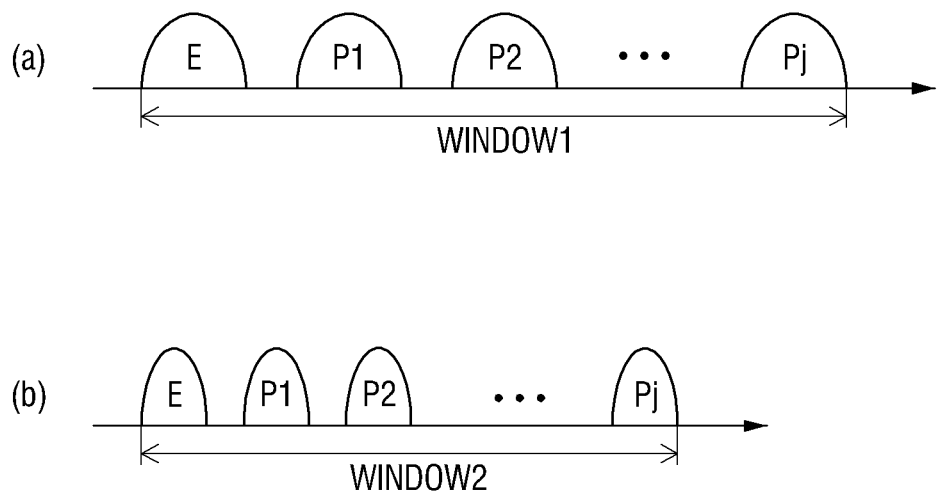
FIG. 9, inclusive of FIGS. 9A and 9B, further illustrates a method of driving a nonvolatile memory device according to certain embodiments of the inventive concept.

FIG. 9, inclusive of FIGS. 9A and 9B, is a conceptual diagram further illustrating a method of driving a nonvolatile memory device according to certain embodiments of the inventive concept.

FIG. 9A shows the results of the first program loop of FIG. 4, and FIG. 9B shows the results of the second program loop following the reverse shift of FIG. 4. A first threshold voltage window (WINDOW1) associated with the first program loop is notably wider than a second threshold voltage window (WINDOW2) associated with the second program loop. Here, the threshold voltage windows WINDOW1 and WINDOW2 respectively indicate a total voltage range between a lowest threshold voltage distribution (E) and a highest threshold voltage distribution (Pj).

As noted above, execution of the first program loop essentially maximizes the number of electrons trapped in the deep region D1. Accordingly, the respective widths of the threshold voltage distributions E through Pj are relatively wide, and the separating intervals between adjacent ones of the threshold voltage distributions E through Pj are also quite wide. As a result, the first window (WINDOW1) is notably wide.

In contrast, execution of the second program following a reverse shift step better matches the number of electrons trapped in the deep region D3 to a target value. Accordingly, execution of driving methods consistent with certain embodiments of the inventive concept allow for very accurate control over definition of individual threshold voltage distributions, separating intervals, and the resulting total window. Accordingly, the second threshold voltage window (WINDOW2) is much more compact or narrow overall.

FIGS. 10, 11, 12, 13 and 14 are respective diagrams of memory systems and/or incorporating electronic devices that may be configured to operate using a driving method according various embodiments of the inventive concept.

Figure 10:
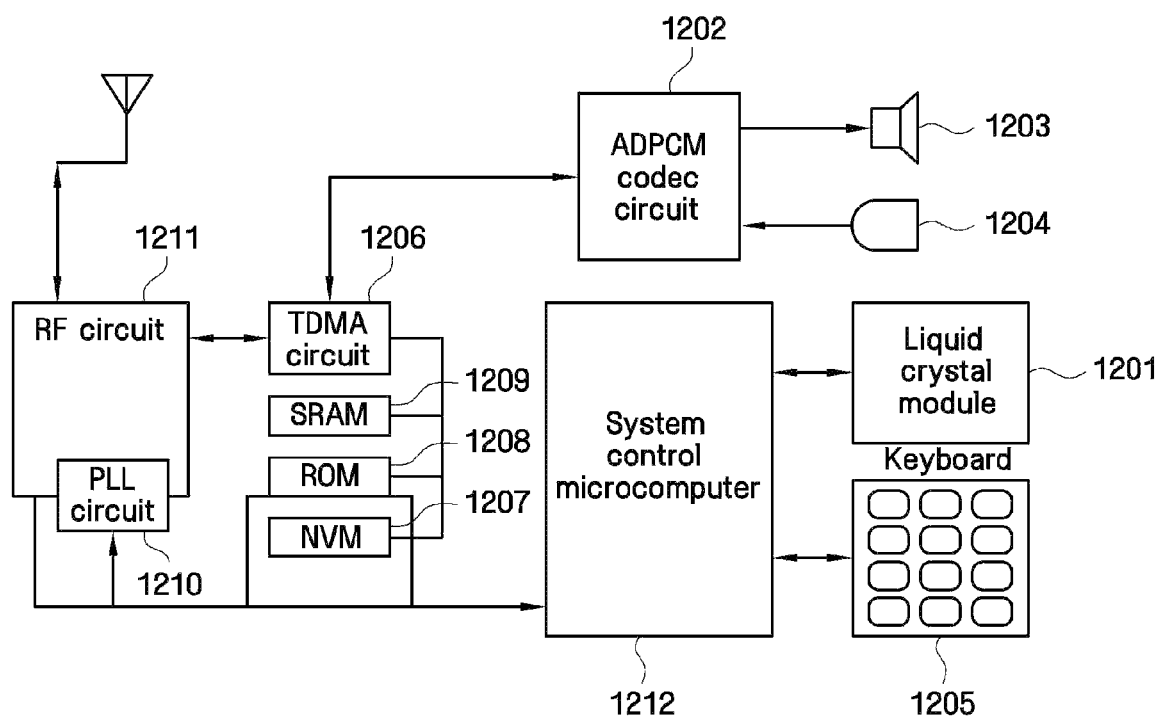
FIGS. 10, 11, 12, 13 and 14 are respective diagrams illustrating memory systems and/or electronic devices that may incorporate certain embodiments of the inventive concept.

FIG. 10 is a block diagram illustrating a cellular phone using a nonvolatile memory device according to an embodiment of the inventive concept.

Referring to FIG. 10, the cellular phone comprises a compression/decompression (ADPCM codec) circuit 1202, a speaker 1203, a microphone 1204, a TDMA circuit 1206 for time-division-multiplexing digital data, a PLL circuit 1210 setting a carrier frequency of a wireless signal, and an RF circuit 1211 for transferring or receiving the wireless signal.

Further, the cellular phone may include various kinds of memory devices, and for example, may include a nonvolatile memory device 1207, a ROM 1208, and an SRAM 1209. The nonvolatile memory device 1207 may be the nonvolatile memory device according to the embodiments of the present inventive concept, and may store, for example, ID numbers. The ROM 1208 may store programs, and the SRAM 1209 may serve as a workspace for a system control microcomputer 1212 or may temporarily store data. Here, the system control microcomputer 1212 may be a processor which can control write and read operations of the nonvolatile memory device 1207.

Figure 11:
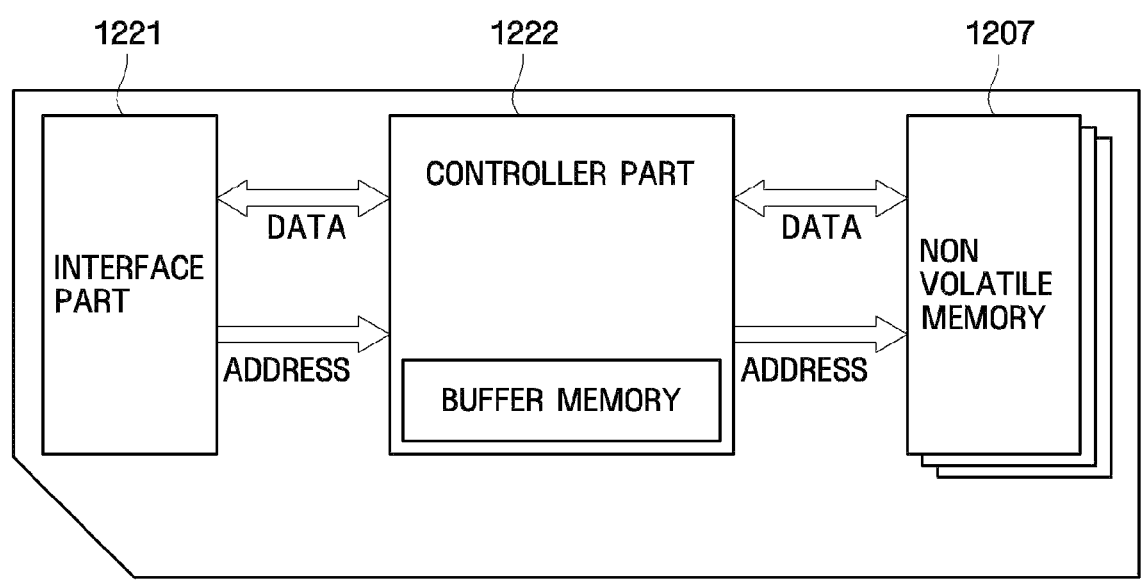

FIG. 11 is a block diagram illustrating a memory card using a nonvolatile memory device according to an embodiment of the inventive concept. The memory card may be, for example, an MMC card, an SD card, a multiuse card, a micro SD card, a memory stick, a compact SD card, an ID card, a PCMCIA card, a SSD card, a chip card, a smart card, or a USB card.

Referring to FIG. 11, the memory card may include at least one of an interface part 1221 performing an interface with an outside, a memory controller 1222 having a buffer memory and controlling the operation of the memory card, and a nonvolatile memory device according to the embodiments of the present inventive concept. The memory controller 1222 is a processor which can control write and read operations of the nonvolatile memory device 1207. Specifically, the memory controller 1222 is coupled to the nonvolatile memory device 1207 and the interface part 1221 through a data bus DATA and an address bus ADDRESS.

Figure 12:
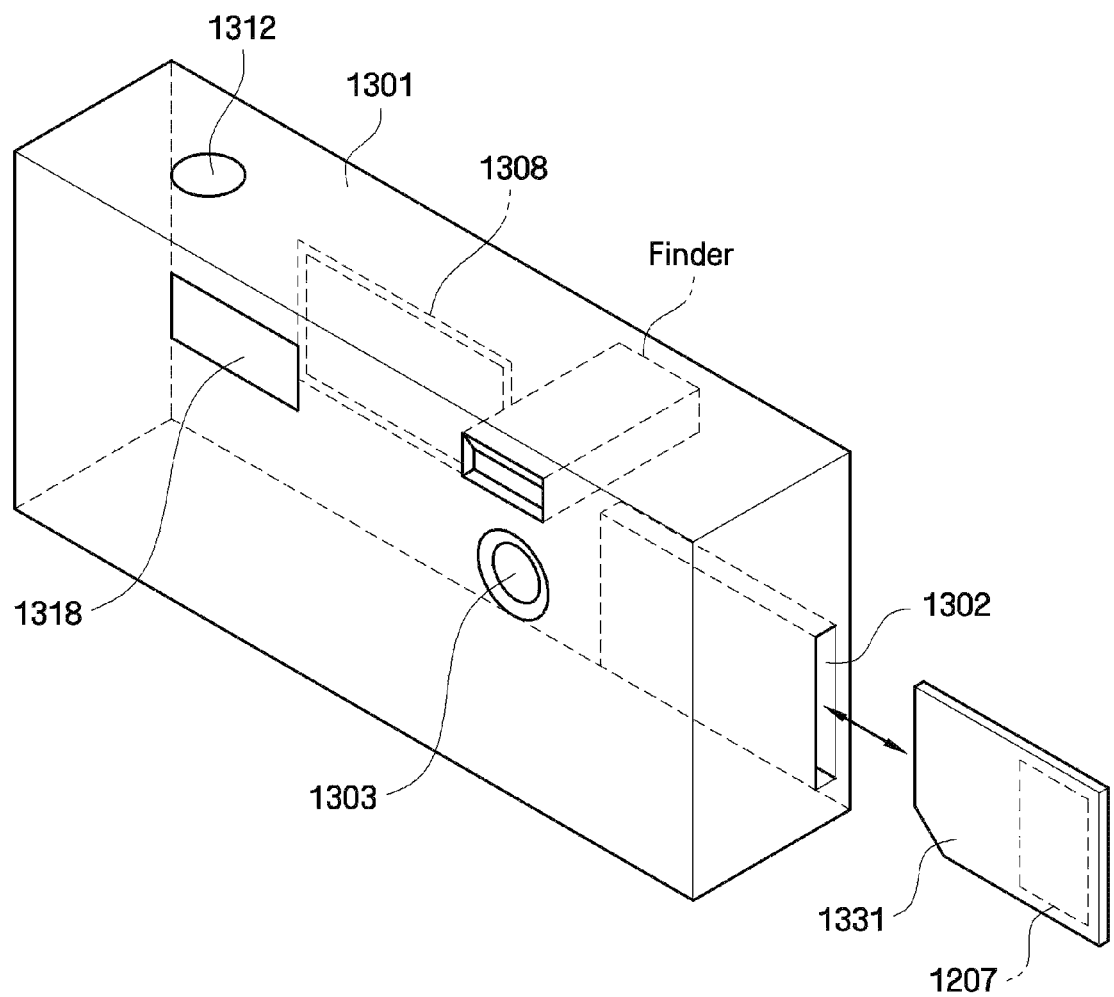

FIG. 12 is a perspective diagram illustrating in relevant portion a digital still camera using a nonvolatile memory device according to an embodiment of the inventive concept.

Referring to FIG. 12, the digital still camera includes a body 1301, a slot 1302, a lens 303, a display unit 1308, a shutter button 1312, and a strobe 1318. In particular, a memory card 1331 may be inserted into the slot 1308, and the memory card 1331 may include at least one nonvolatile memory device 1207 according to embodiments of the present inventive concept.

If the memory card 1331 is of a contact type, the memory card 1331 comes in electrical contact with a specific electrical circuit on a circuit board when the memory card 1331 is inserted into the slot 1308. If the memory card 1331 is of a non-contact type, the memory card 1331 performs communications through a wireless signal.

Figure 13:
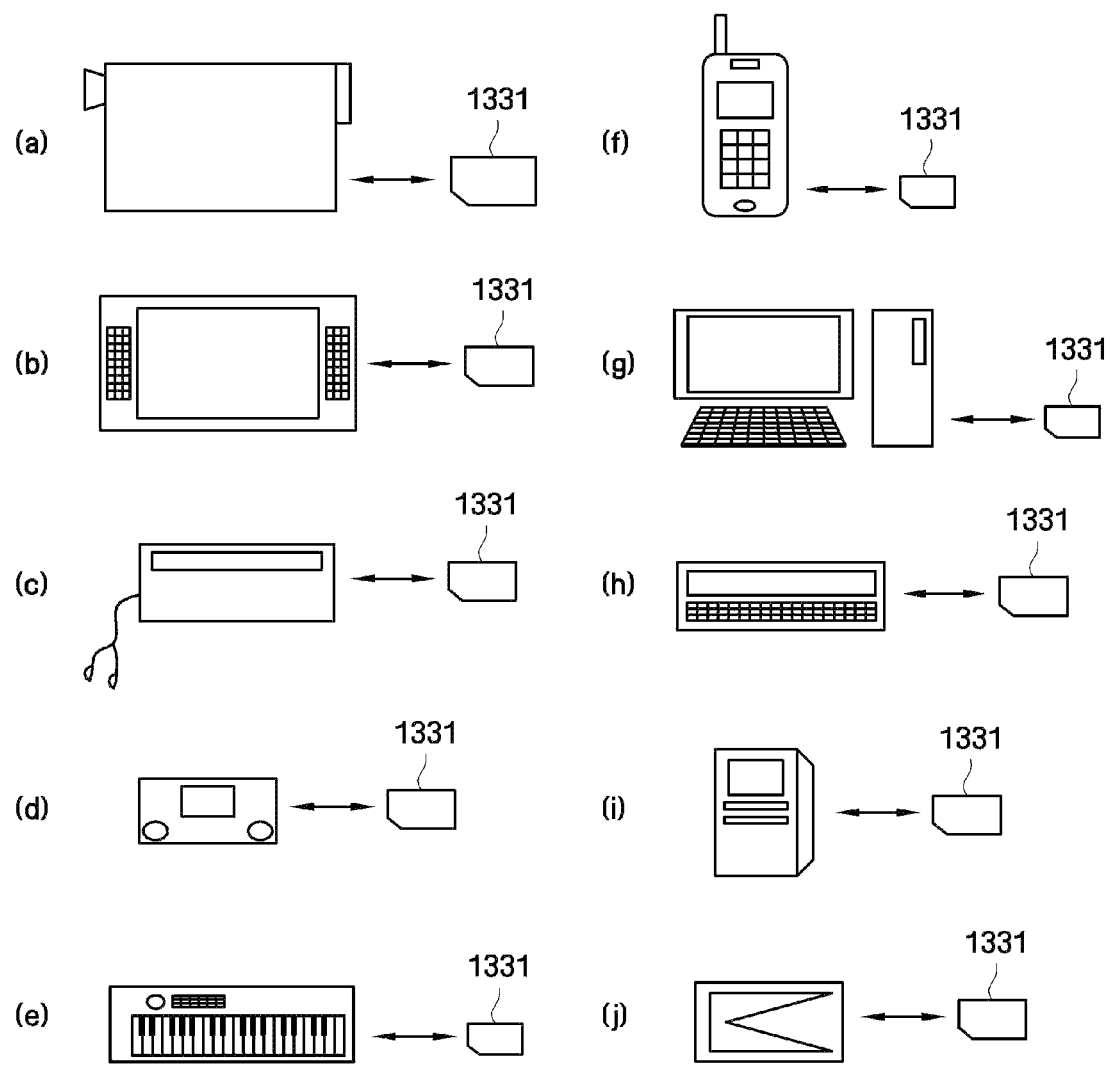

FIG. 13, inclusive of FIGS. 13A, 13B, 13C, 13D, 13E, 13F, 13G, 13H, 13I and 13J, variously illustrates certain electronic device that may incorporate or run in response to the memory card of FIG. 11. In each embodiment, a memory card 1331 is shown in conjunction with a (a) video camera, (b) television receiver, (c) audio device, (d) game machine, (e) electronic music device, (f) cellular phone, (g) computer, (h) a personal digital Assistant, (i) voice recorder, and (j) PC card.

Figure 14:
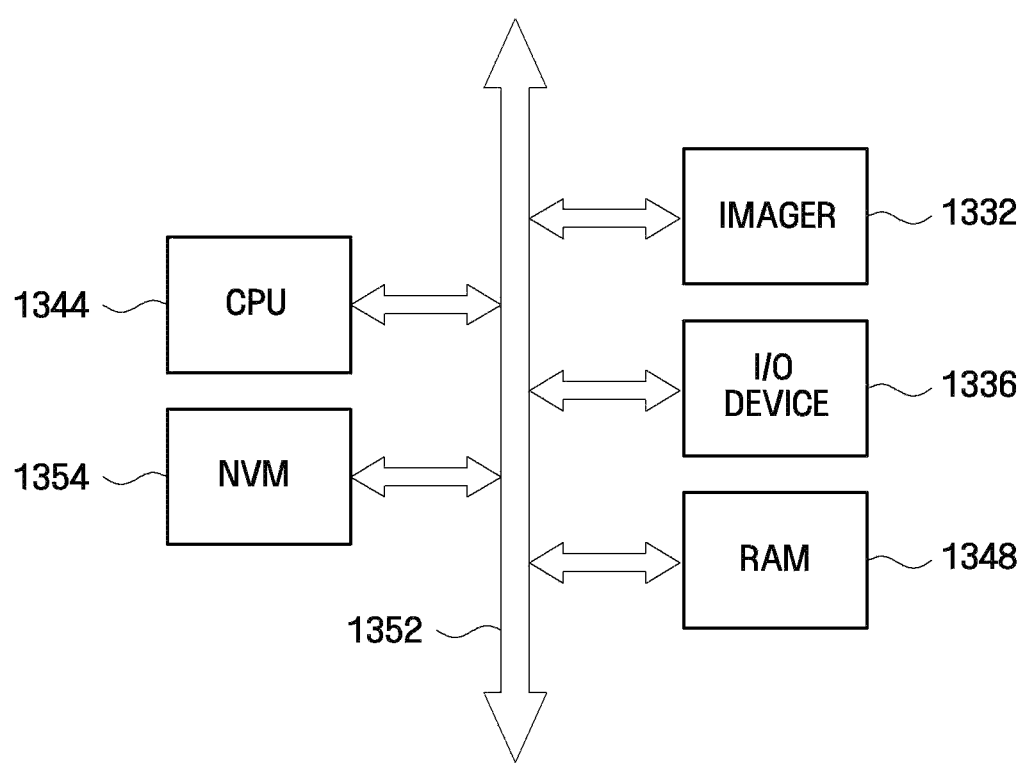

FIG. 14 is a block diagram illustrating an image sensor system that may incorporate a nonvolatile memory device according to an embodiment of the inventive concept.

Referring to FIG. 14, an image sensor system may include an image sensor 1332, an input/output device 1336, a RAM 1348, a CPU 1344, and a nonvolatile memory device 1354 according to embodiments of the present inventive concept. The respective constituent elements, that is, the image sensor 1332, the input/output device 1336, the RAM 1348, the CPU 1344, and the nonvolatile memory device 1354 communicate with each other through a bus 1352. The image sensor 1332 may include a photo sensing element, such as a photo gate and a photodiode. The respective constituent elements may be constructed into one chip together with a processor, or may be constructed as a separate chip from the processor.

Those skilled in the art will appreciate that many variations and modifications can be made to the illustrated embodiments without substantially departing from the scope of the inventive concept as defined by the following claims.

What is claimed is:

1. A method of driving a nonvolatile memory device, comprising:
    forward shifting threshold voltages of nonvolatile memory cells by executing a first program loop with respect to the nonvolatile memory cells; and thereafter,
    reverse shifting the threshold voltages of the nonvolatile memory cells; and
    again forward shifting the threshold voltages of the nonvolatile memory cells by executing a second program loop with respect to the nonvolatile memory cells.

2. The method of claim 1, wherein executing the first program loop with respect to the nonvolatile memory cells comprises using a first set of program pulses to program the nonvolatile memory cells, the first set of program pulses including a first initial program pulse and a first final program pulse, and
    executing the second program loop with respect to the nonvolatile memory cells comprises using a second set of program pulses different from the first set of program pulses to program the nonvolatile memory cells, the second set of program pulses including a second initial program pulse and a second final program pulse.

3. The method of claim 2, wherein the first set of program pulses is defined by a first incremental step pulse program (ISSP) using a first incremental step, and
    the second set of program pulses is defined by a second ISSP using a second incremental step different from the first incremental step.

4. The method of claim 3, wherein the first incremental step is larger than the second incremental step.

5. The method of claim 3, wherein a voltage level of the second initial program pulse is less than a voltage level of the first final program pulse.

6. The method of claim 3, wherein a voltage level of the second initial program pulse is less than a voltage level of the first initial program pulse.

7. The method of claim 1, wherein the reverse shifting of the threshold voltages of the nonvolatile memory cells comprises performing a weak erase operation on the nonvolatile memory cells.

8. The method of claim 1, wherein the forward shifting of the threshold voltages of the nonvolatile memory cells generates a first threshold voltage distribution for the nonvolatile memory cells having a first width and a first average threshold voltage level, and
    the again forward shifting of the threshold voltages of the nonvolatile memory cells generates a second threshold voltage distribution for the nonvolatile memory cells having a second width less than the first width, and a second average threshold voltage level lower than the first average threshold voltage level.

9. The method of claim 1, wherein each one of the shifting of the threshold voltages of the nonvolatile memory cells and the again shifting of the threshold voltages of the nonvolatile memory cells moves the threshold voltages of the nonvolatile memory cells in a positive direction, and
    the reverse shifting of the threshold voltages of the nonvolatile memory cells moves the threshold voltages of the nonvolatile memory cells in a negative direction.

10. The method of claim 1, wherein at one of the nonvolatile memory cells is a charge trap flash (CTF) memory cell.

11. A method of driving a nonvolatile memory device including first nonvolatile memory cells commonly connected to a first word line and second nonvolatile memory cells commonly connected to a second word line, the method comprising:
    forward shifting threshold voltages of the first nonvolatile memory cells by a first degree by executing a first program loop with respect to the first nonvolatile memory cells; and thereafter,
    reverse shifting the threshold voltages of the first nonvolatile memory cells by a second degree; and
    again forward shifting the threshold voltages of the first nonvolatile memory cells by a third degree by executing a second program loop with respect to the first nonvolatile memory cells.

12. The method of claim 11, further comprising:
    forward shifting threshold voltages of the second nonvolatile memory cells by a fourth degree by executing a third program loop with respect to the second nonvolatile memory cells; and thereafter,
    reverse shifting the threshold voltages of the second nonvolatile memory cells by a fifth degree; and again forward shifting the threshold voltages of the second nonvolatile memory cells by a sixth degree by executing a fourth program loop with respect to the second nonvolatile memory cells.

13. The method of claim 12, wherein the first nonvolatile memory cells are disposed in a first block and the second nonvolatile memory cells are disposed in a second block different from the first block, and the second degree and the fifth degree are different.

14. The method of claim 12, wherein first nonvolatile memory cells are single-level memory cells (SLC) and the second nonvolatile memory cells are multi-level memory cells (MLC), and the second degree and the fifth degree are different.

15. The method of claim 12, wherein first nonvolatile memory cells have a first level and the second nonvolatile memory cells have a second wear level different from the first wear level, and the second degree and the fifth degree are different.

16. A method of driving a nonvolatile memory device including nonvolatile memory cells configured to be programmed according to a number of threshold voltage distributions including an erase voltage distribution and a highest voltage distribution, wherein a voltage range between the erase voltage distribution and the highest voltage distribution defines a threshold voltage window for the nonvolatile memory cells, the method comprising:

performing a first program loop with respect to nonvolatile memory cells using a first set of program pulses to generate a first threshold voltage window; and thereafter, reverse shifting the threshold voltages of the nonvolatile memory cells; and performing a second program loop with respect to the nonvolatile memory cells using a second set of program pulses different from the first set of program pulse to generate a second threshold voltage window less wide than the first threshold voltage window.

17. The method of claim 16, wherein the first set of program pulses is defined by a first incremental step pulse program (ISSP) using a first incremental step, and the second set of program pulses is defined by a second ISSP using a second incremental step different from the first incremental step.

18. The method of claim 17, wherein the first incremental step is larger than the second incremental step.

19. The method of claim 16, wherein the reverse shifting of the threshold voltages of the nonvolatile memory cells comprises performing a weak erase operation on the nonvolatile memory cells.

20. The method of claim 16, wherein each one of the shifting of the threshold voltages of the nonvolatile memory cells and the again shifting of the threshold voltages of the nonvolatile memory cells moves the threshold voltages of the nonvolatile memory cells in a positive direction, and the reverse shifting of the threshold voltages of the nonvolatile memory cells moves the threshold voltages of the nonvolatile memory cells in a negative direction.

* * * * *